United States Patent
Clark et al.

(10) Patent No.: US 6,549,037 B1
(45) Date of Patent: Apr. 15, 2003

(54) APPARATUS AND CIRCUIT HAVING REDUCED LEAKAGE CURRENT AND METHOD THEREFOR

(75) Inventors: Lawrence T. Clark, Phoenix, AZ (US); Kimberley E. Wagner, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/602,667

(22) Filed: Jun. 26, 2000

(51) Int. Cl.[7] .......................................... H03K 19/0175
(52) U.S. Cl. ........................... 326/83; 326/55; 326/113; 327/65; 327/215
(58) Field of Search ........................... 326/83, 113, 89, 326/54, 55; 327/65, 215, 306

(56) References Cited

U.S. PATENT DOCUMENTS

| | | | |
|---|---|---|---|
| 5,355,035 A | * | 10/1994 | Vora et al. .................. 307/494 |
| 5,391,938 A | * | 2/1995 | Hatsuda ....................... 327/71 |
| 5,486,785 A | * | 1/1996 | Blankenship ................ 327/306 |
| 5,568,069 A | * | 10/1996 | Chow .......................... 326/113 |
| 5,898,321 A | * | 4/1999 | Ilkbahar et al. .............. 326/87 |
| 6,246,265 B1 | * | 6/2001 | Ogawa ......................... 326/95 |
| 6,310,509 B1 | * | 10/2001 | Davenport et al. ......... 327/407 |

OTHER PUBLICATIONS

Texas Instruments Data Sheet, "SN54180, SN74180 9–Bit Odd/Even Parity Generators/Checkers", Dec. 1972, pp. 2–597 through 2–599.*

J.B. Kuo, J.H. Lou, "Low–Voltage CMOS VLSI Circuits," pp. 163–234, John Wiley & Sons, Inc., New York. Date Missing.

J.P. Uyemura, "Circuit Design for CMOS VLSI", pp. 166–206, Kluwer Academic Publishers, Boston. Date Missing.

* cited by examiner

Primary Examiner—Daniel Chang
(74) Attorney, Agent, or Firm—Kenneth M. Seddon

(57) ABSTRACT

Briefly, in accordance with one embodiment of the invention, an integrated circuit comprises a first stage that provides differential outputs in one mode and substantially equal outputs in another mode.

16 Claims, 2 Drawing Sheets

APPARATUS AND CIRCUIT HAVING REDUCED LEAKAGE CURRENT AND METHOD THEREFOR

This is a continuation of application Ser. No. 09/602,667 filed on Jun. 26, 2000.

BACKGROUND

To improve the performance capability of a microprocessor, it is often desirable to increase the speed or clock rate at which the microprocessor operates. Higher clock rates may be possible by reducing the amount of time it takes for a particular circuit within the microprocessor to process its input signals and provide its output signal. To this end, various dynamic logic circuits have been developed that have improved performance characteristics as compared to some traditional complementary metal-oxide semiconductor (CMOS) circuits. Examples of such dynamic logic circuits include domino logic circuits, skew tolerant domino circuits, latched domino circuits, differential domino circuits, and the like.

However, as the operational speed of the circuits within an integrated circuit is increased, race conditions within the integrated circuit may occur. To address the problems associated with race conditions, a clock is often used to synchronize the operation of circuits within the integrated circuit relative to each other. Examples of such circuits are summarized in Chapter Four of "Low-Voltage CMOS VLSI Circuit," by Luo et al. (1999) and Chapter 5.7 of "Circuit Design for CMOS VLSI," by John P. Uyemyra (1992).

The use of a clock may reduce the risk that the output provided by a fast circuit to a slower circuit changes before the slower circuit is able to properly process the output of the faster circuit. However, the use of a clock may also regulate or delay the operation of the fastest sub-circuits within an integrated circuit. This, in turn, may not allow the faster sub-circuits within the integrated circuit to take advantage of time-borrowing (e.g., process input signals as soon as the input signals are provided to the sub-circuit). Furthermore, a clock may also be used to hold a sub-circuit in a precharge state until the sub-circuit is allowed to process information. Thus, the use of a clock may result in a circuit being in a precharge condition during a portion of the clock cycle. This may result in the integrated circuit consuming more current, which is generally not desirable in low-power applications. Thus, there is a continuing need for better ways to improve the performance of an integrated circuit while reducing its power consumption.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
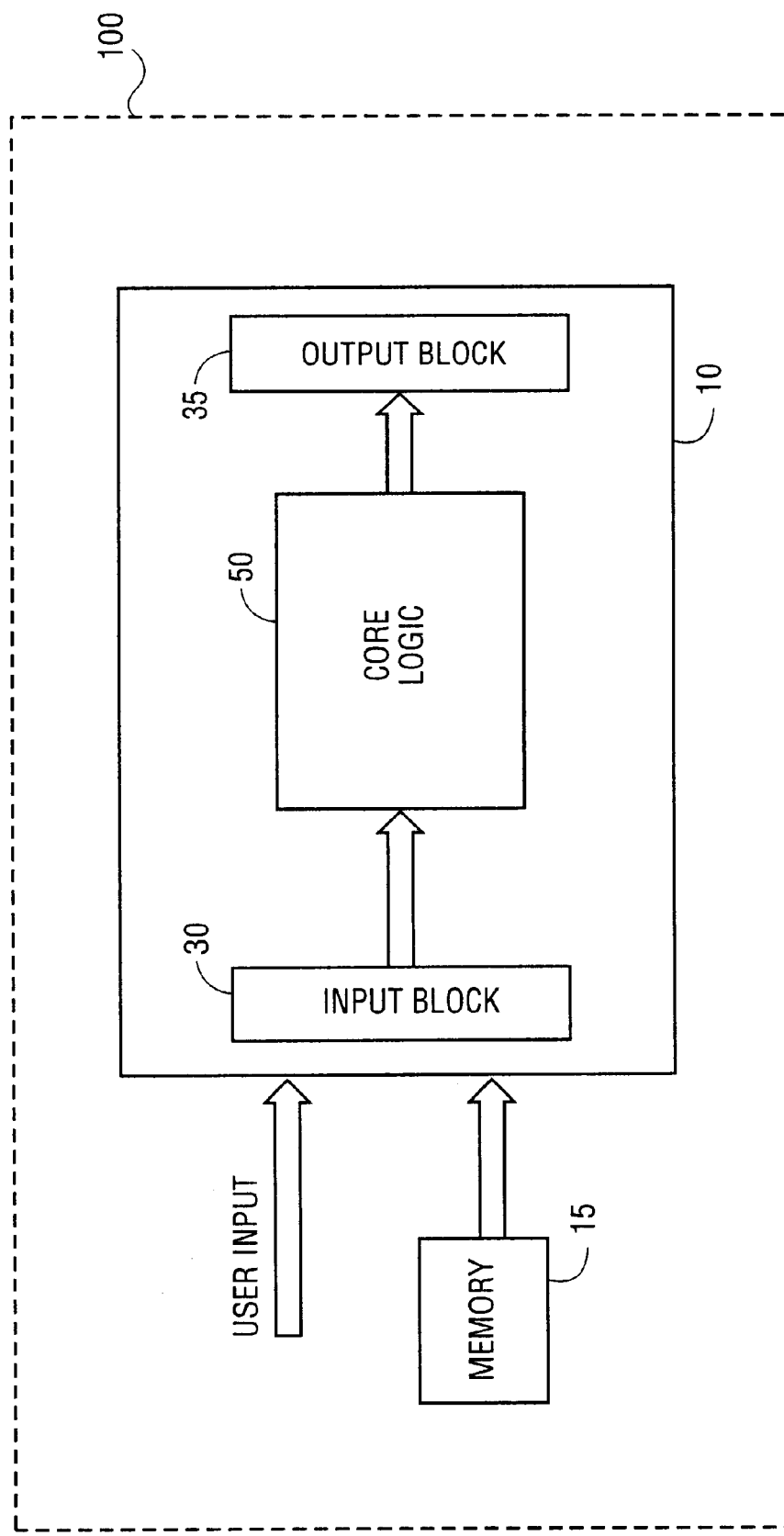
FIG. 1 is a schematic representation of a portion of a portable device in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, component, and circuits have not been described in detail so as not to obscure the present invention. Note, in this description a "#" symbol is used to indicate the logical complement of a signal. For example, if BL is a logic "1," then BL# is a logic "0," although this invention is not limited to any particular signaling scheme. However, the "#" symbol does not mean that the signal must be the logical complement at all times. There may be alternative operational modes where BL ;nd BL# are substantially equal as explained in more detail hereinafter.

Turning to FIG. 1, an embodiment 100 in accordance with the present invention is described. Embodiment 100 may comprise a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Embodiment 100 includes an integrated circuit 10 that may comprise, for example, a microprocessor, a digital signal processor, a microcontroller, a memory array, such as static random access memory (SRAM), or the like. However, it should be understood that the scope of the present invention is not limited to these examples. Embodiment 100 may also include a memory 15, such as Flash memory, read-only memory, or the like, that may provide integrated circuit 10 with instructions or information during the operation of embodiment 100. However, it should be understood that the scope of the present invention is not limited to the type of memory used with integrated circuit 10, nor is the scope limited so as to require that instructions or data be provided by a memory. In alternative embodiments, integrated circuit 10 may contain the instructions and or data to be processed, or the information may be provided from an external source such as from a user as indicated in FIG. 1 as user input.

As shown in FIG. 1, integrated circuit 10 may comprise, among other things, an input block 30 that may be used to receive input signals and provide them to a core logic 50. Integrated circuit 10 may also include an output block 35 that may be used to provide the results of the processing performed by core logic 50 of integrated circuit 10. For example, output block 35 may provide information to other portions of embodiment 100 or to an output device such as a display (not shown), although the scope of the present invention is not limited in this respect. As explained in more detail hereinafter, embodiments of the present invention attempt to reduce the amount of power that is consumed by integrated circuit 10 by placing all or portions of core logic 50 into a non-conducting, standby mode when those portions of core logic 50 are not in use. By reducing the amount of current that is consumed by core logic 50, it may be possible to reduce the amount of power consumed by integrated circuit 10 during its operation.

Figure 2:
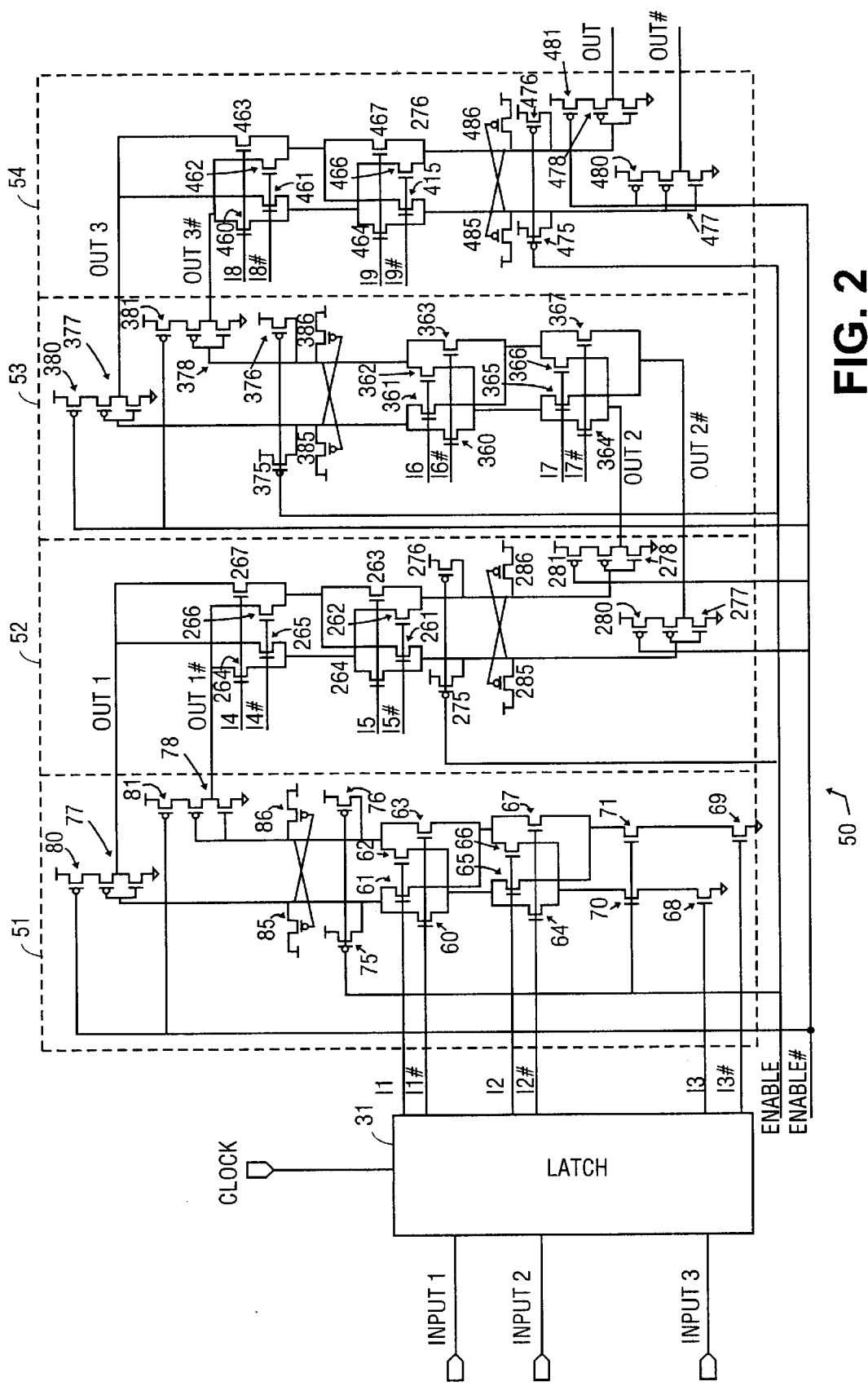
FIG. 2 is a circuit in accordance with a particular embodiment of the present invention.

Referring now to FIG. 2, a circuit in accordance with a particular embodiment of the present invention is provided. In this particular embodiment, the circuit illustrated is intended to perform an exclusive-or (XOR) logic operation based on the logic value of nine inputs (labeled I1–I9). The XOR operation is often used to provide multiply-and-accumulate (MAC) instructions in DSP's and is illustrated in this particular embodiment because the XOR logic operation is considered by many to be one of the more difficult logic operations to implement. By presenting a particular embodiment using one of the more complex logic operations, it will be apparent to those skilled in the art how alternative embodiments of the present invention may implement other logic operations such as AND, NOR, OR, NAND, and the like. Again, it should be understood that the scope of the present invention is not limited to circuits that implement the XOR operation or to circuits that have nine inputs.

The circuit shown in FIG. 2 comprises a first stage 51, a second stage 52, a third stage 53, and a fourth stage 54 that may co-operate to perform a nine-input XOR operation. Again, the circuit shown in FIG. 2 may only represent a relatively small portion of core logic 50 (see FIG. 1). In this particular embodiment, stages 51–54 comprise transistors that receive one or more inputs signals and provide one or more output signals. The output signals of one stage may then be used by subsequent stages to perform additional logic operations. For example, the output voltage potentials of first stage 51 may be received by the drain terminals of transistors 264–267 in second stage 52, although this is not intended as a limitation upon the scope of the present invention.

In this particular embodiment, stages 51–54 may include two stacks that are arranged to provide, at least in part, the XOR logic operation. For example, the two stacks of first stage 51 may be provided by transistors 60–69 that are adapted to receive input signals (e.g., signals labeled I1–I3 and I1#–I3#). In this particular embodiment, a stack refers to the series of n-channel transistors (e.g., transistors 60–69) that provides a current path from the power supply 20 voltage to the ground potential. The current path provides, at least in part, one of the output voltage potentials (e.g. OUT1 or OUT1#). Of course in this particular embodiment the actual current path is determined, at least in part, by the logical value of input signals I1–I3 and I1#–I3#. As explained below, during normal operation, the other stack provides the other differential output voltage potential. It should be understood that the scope of the present invention is not limited by the number of stacks or by the number of transistors in a particular stack. In alternative embodiments, the stacks and the number of transistors in a stack may be arranged to provide other logic operations.

As mentioned earlier, a clock signal is often used in conventional microprocessors to control to flow of information through the microprocessors and to synchronize the operation of sub-circuits within the microprocessor. In contrast, embodiments of the present invention do not require the use a periodic clock signal to control the operation of stages 51–54. Rather, an enable signal may be used to selectively control the operation, at least in part, of stages 51–54. As explained in more detail below, this may allow portions of the circuits within core logic 50 to take advantage of time-borrowing and operate faster than conventional circuits. Nonetheless, as shown in FIG. 1, portions of core logic 50, such as first stage 51, may receive input signals from external sources or from other circuits that are controlled by a clock, although the scope of the present invention is not limited to the source of the input signals or by the use of a clock signal to store input data.

As shown in FIG. 2, first stage 51 may receive input signals from a latch 31 that may be a D flip-flop, or the like. Latch 31 may store the input signals received by input block 30 (see FIG. 1) that are to be provided to core logic 50. A clock signal may be used to latch the value of the input signals (e.g., INPUT1–INPUT3). The use of a latching device and a clock signal may be desirable because input signals INPUT1–INPUT3 may be available to core logic 50 for a limited amount of time. In alternative embodiments, latch 31 may provide input signals INPUT1–INPUT3, labeled I1–I3, respectively, and their logical complement as well (e.g., I1#–I3#).

To reduce the amount of power consumed by the transistors in core logic 50 (e.g., transistors 60–69), it may be desirable to design integrated circuit 10 so that it may operate in at least two different operational modes. For example, one mode where the transistors of core logic 50 are powered up and in normal operation, and another mode where all or some of the transistors are disabled so that they do not consume power (e.g., a standby mode). This may be achieved, at least in part, through the use of n-channel transistors 70–71 that are placed in series in the stack with transistors 60–69. Transistors 70–71 may be n-channel transistors, although the scope of the present invention is not limited in this respect. As shown, the gate terminal of transistors 70–71 may receive an enable signal, ENABLE, that may be used to control the operational mode of all or some of the transistors in core logic 50. ENABLE may be provided from a variety of sources, including, but not limited to, from a direct request from the user to enter standby mode or from a state machine that has determined that at least a portion of core logic 50 may enter standby mode.

For example, if first stage 51 is not currently in use, ENABLE may be deactivated to indicate that first stage 51 may enter into a low-power, standby mode. A sufficiently low voltage potential on the gate terminal of transistors 70–71 may disconnect the stacks of first stage 51 from the ground voltage potential, and thus, create an electrical "open." Consequently, the flow of current through first stage 51 may be disabled and the overall power consumption of core logic 50 may be reduced. In contrast, if first stage 51 is active and in use, enable signal ENABLE may be asserted so that first stage 51 may return to normal operation.

First stage 51 may also include p-channel transistors 75–76 that may be used to provide, at least in part, the outputs signals of first stage 51 when first stage 51 is in the deactivated standby mode. As shown, the gate terminal of p-channel transistors 75–76 may also receive the ENABLE signal so that when ENABLE is deactivated (e.g., a sufficiently low voltage potential), p-channel transistors 75–76 may connect the stacks of first stage 51 to the power supply voltage (e.g. Vdd). In this particular embodiment, first stage 51 includes inverters 77–78 that invert the voltage potential provided by transistors 60–69 and 75–76. Consequently, when ENABLE is deactivated (e.g., indicating that first stage 51 is to enter a low-power mode of operation) the output voltage potentials of first stage 51, labeled OUT1 and OUT1# may be substantially equal and approximately equal the ground voltage potential (e.g., zero volts or Vss).

First stage 51 may also include p-channel transistors 80–81 that may be used to connect inverters 77–78 to a power supply voltage (e.g., Vdd) through the use of the ENABLE# signal. For example, if first stage 51 is in normal operation, the enable signal ENABLE may be active and ENABLE# may be deactivated. Consequently, transistors 80–81 may be turned on so that the stacks of first stage 51 may be connected to the power supply voltage (e.g., Vdd). When first stage 51 enters a standby operational mode, ENABLE# may be activated and transistors 80–81 may be turned off. In standby mode, transistors 80–81 and the p-channel devices of inverters 77–78 may isolate the output voltage potentials of first stage 51 (e.g., OUT1 and OUT1#) from the power supply voltage.

The use of two transistors to isolate the output signal (e.g., OUT1 and OUT1#) of first stage 51 from the power supply voltage (e.g., $V_{DD}$) may significantly reduce the amount of leakage current that may flow through inverters 77–78 and the stacks of first stage 51. In addition, in particular embodiments of the present invention, stacked devices that have their gate terminals driven to the same non-conducting potential (e.g., transistors 264–267 of second stage 52) may have reduced leakage current. For example, particular embodiments of the present invention may reduce the leakage current through a stage by as much as ninety percent as compared to a circuit that did not include transistors 80–81 and stages with stacked devices.

To resume normal operation, ENABLE may be activated and ENABLE# may be deactivated so that transistors 60–69 may be connected between power supply voltage (e.g., Vdd) and the ground voltage potential (e.g., Vss). As shown in FIG. 2, both stacks of first stage 51 include at least one transistor that is enabled by an input signal (e.g., I1–I3 and I1–I3). Consequently, regardless of the logic values of I1–I3, there may be a current path between transistors 60–69 that may permit one side or stack of first stage 51 to sink current. As a result, one of transistors 85–86 may be enabled so as to connect the other side or stack of first stage 51 to the power supply voltage (e.g., Vdd). Thus, during normal operation, first stage 51 may provide differential outputs (e.g., logical complements) that represent the XORing of I1–I3, although the scope of the present invention is not limited in this respect. In alternative embodiments, the arrangement of transistors 60–69 may be changed as desired to provide other logic operations.

Thus, when first stage 51 is in a low-power operational mode, its outputs (e.g., OUT1 and OUT1# may both driven to the ground voltage potential even though the labeling convention might suggest that the signals are always the logical complement of each other. To be clear, OUT1 and OUT1# are not the logical complement of each other when first stage 51 is in a standby mode. Rather, both output voltage potentials are substantially equal.

However, when ENABLE is activated and first stage 51 returns to normal operation, the output of first stage 51, namely OUT1 and OUT1#, are the logical complement of each other.

The circuit shown in FIG. 2 also comprises additional stages 52–54 that may be adapted to receive the output of the previous stage as well as other input signals (e.g., I4–I9 and their logical complement I4#–I9#). In this particular embodiment, stages 52–54 may be the same or similar to first stage 51. For example, transistors 260–267, 360–367, and 460–467 may have the same or similar purpose as transistors 60–67 of first stage 51.

However, one notable exception is that stages 52–53 do not include an equivalent to n-channel channel transistors 70–71 because second stage 52, third stage 53, and fourth stage 54 may not need to be electrically isolated from the power supply voltages. This is due, at least in part, because in this particular embodiment it is assumed that the input signals I4–I9, and their logical complement I4#–I9#, are provided by another stage (not shown) that is the same or similar to first stage 51, although the scope of the present invention is not limited in this respect. Since, I4–I9 and their logical compliments are provided by other stages that are similar to first stage 51, it may be assumed that the output of those other stages are also substantially equal to the ground voltage potential when the ENABLE signal is deactivated.

Thus, when ENABLE is deactivated, it may be assumed that I4–I9 and I4#–I9# are all substantially equal to the ground voltage potential. Consequently, transistors 260–267, 360–367, and 460–467 are disabled and the flow of current through stages 52–54 may also be disabled. Furthermore, if ENABLE is disabled, then the combination of transistors 275–276, 375–376, 475–476 with inverters 277–278, 377–378, and 477–478, respectively, sets both outputs of stages 52–54, namely OUT2, OUT2#, OUT3, OUT3#, OUT4, and OUT4#, substantially equal to the ground voltage potential.

When the ENABLE signal is activated, stages 51–54, along with the other stages that provide input signals 14–19 are enabled so that core logic 50 (see FIG. 1) may provide the desired logic operation. In this particular embodiment, the operation of stages 51–54 is not regulated through the use of a periodic clock signal, and thus, stages 51–54 are permitted to provide their output signals without having to wait a prerequisite amount of time. Thus, particular embodiments of the present invention may be able to take advantage of time-borrowing (e.g., a stage may provide its output signals as soon as the input signals are provided and processed).

In addition, particular embodiments of the present invention may also offer an advantage in power savings by selectively disabling the flow of current through some or all of the stages. When it is determined that all or a portion of core logic 50 may enter a standby mode, the ENABLE signal may be deactivated so that the outputs of a stage may be driven to a known value that reduces the flow of current through subsequent stages. Thus, the use of a non-periodic enable signal may increase the speed at which an integrated circuit may operate and reduce the amount of power consumed when all or a portion of the integrated circuit is in a standby mode.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus having an integrated circuit, the integrated circuit comprising;

a first stage adapted to provide a first output voltage potential and a second output voltage potential that are substantially equal when the integrated circuit is in a first operational mode and differential when the integrated circuit is in a second operational mode, and wherein the first stage further comprises an n-channel transistor and at least two p-channel transistors having a gate terminal adapted to receive an enable signal; and a second stage coupled to the first stage and comprising at least two transistors, wherein the second stage is adapted to provide a third output voltage potential and a fourth output voltage potential that are substantially equal when the integrated circuit is in the first operational mode.

2. The apparatus of claim 1, wherein the first stage is further adapted so that the first output voltage potential and the second output voltage potential are approximately equal to zero volts when the integrated circuit is in the first operational mode.

3. The apparatus of claim 1, wherein the first stage includes a first stack having a first transistor coupled to a second transistor, wherein the gate of the first transistor is adapted to receive a first input signal and the gate of the second transistor is adapted to receive a second input signal.

4. The apparatus of claim 3, wherein the first stage includes a second stack having a third transistor coupled to a fourth transistor, wherein the gate of the third transistor is adapted to receive the logical complement of the first input signal and the fourth transistor is adapted to receive the logical complement of the second input signal.

5. The apparatus of claim 1, wherein the second stage includes a first stack adapted to receive the first output voltage potential and a second stack adapted to receive the second output voltage potential.

6. The apparatus of claim 5, wherein the first stack comprises a first transistor coupled to a second transistor, and wherein the gate terminal of first transistor is adapted to receive a first input signal and the gate terminal of the second transistor is adapted to receive a second input signal.

7. The apparatus of claim 6, wherein the second stack comprises a third transistor coupled to a fourth transistor, and wherein the gate terminal of the third transistor is adapted to receive the logical complement of the first input signal and the gate terminal of the fourth transistor is adapted to receive the logical complement of the second input signal.

8. The apparatus of claim 6, wherein the second stage further comprises a p-channel transistor coupled to the first stack.

9. An integrated circuit comprising:
a first stage adapted to receive at least two input signals, wherein the first stage is adapted to provide a first output signal and a second output signal, the first output signal being differential with respect to the second output signal, and wherein the first stage further comprises at least two p-channel metal oxide semiconductor (PMOS) transistors having a gate terminal adapted to receive an enable signal; and
a second stage adapted to receive at least two input signals, the first output signal, and the second output signal, wherein the second stage is further adapted to provide a third output signal and a fourth output signal, and
wherein the first output signal, the second output signal, the third output signal, and the fourth output signal are substantially equal when the integrated circuit is in a first mode for all combinations of values of the at least two input signals of the first stage and second stage.

10. The integrated circuit of claim 9, wherein the first stage and the second stage are adapted so that the third output signal represents the exclusive-or of the first plurality of input signals and the second plurality of input signals when the integrated circuit is in a second mode.

11. The integrated circuit of claim 9, further comprising a third stage adapted to receive at least two input signals, the third output signal, and the fourth output signal, wherein the third stage is adapted to provide a fifth output signal and a sixth output signal, and wherein the first output signal, the second output signal, the fifth output signal, and the sixth output signal are substantially equal when the integrated circuit is in the first mode.

12. A method of reducing the flow of current through a first stage and a second stage of an integrated circuit, comprising:
selectively disabling the flow of current through at least a portion of the first stage of the integrated circuit, the first stage including two p-channel transistors; and
driving a pair of differential outputs of the first stage and the second stage so that a pair of differential outputs of the first stage and the second stage are substantially equal.

13. The method of claim 12, wherein selectively disabling the flow of current includes disabling an n-channel transistor in a stack in the first stage of the integrated circuit.

14. The method of claim 13, wherein disabling an n-channel transistor includes applying a non-periodic enable signal to a gate terminal of the n-channel transistor.

15. The method of claim 12, wherein driving a pair of differential outputs includes applying a non-periodic enable signal to a portion of the first stage of the integrated circuit.

16. The method of claim 15, further comprising enabling the first stage so that the pair of differential outputs of the first stage are the logical complement of each other.

* * * * *

UNITED STATES PATENT AND TRADEMARK OFFICE
CERTIFICATE OF CORRECTION

PATENT NO.     : 6,549,037 B1
DATED          : April 15, 2003
INVENTOR(S)    : Clark et al.

It is certified that error appears in the above-identified patent and that said Letters Patent is hereby corrected as shown below:

Column 2,
Line 12, delete "component", insert -- components --.
Line 20, delete ";nd", insert -- and --.

Column 5,
Line 23, before "power supply", insert -- the --.

Signed and Sealed this

Seventh Day of October, 2003

JAMES E. ROGAN
*Director of the United States Patent and Trademark Office*